United States Patent [19]

Masada

[11] Patent Number: 4,771,922

[45] Date of Patent: Sep. 20, 1988

[54] AUTOMATIC JUMPER WIRE FEEDER

[75] Inventor: Daizo Masada, Urayasu, Japan

[73] Assignee: Emhart Industries, Inc., Farmington, Conn.

[21] Appl. No.: 909,342

[22] Filed: Sep. 19, 1986

[30] Foreign Application Priority Data

Sep. 26, 1985 [JP] Japan ................................ 60-213385

[51] Int. Cl.<sup>4</sup> .......................... B27F 7/21; H01R 43/04
[52] U.S. Cl. ..................................... 227/84; 29/566.1;
29/33 F; 29/741; 227/90
[58] Field of Search ...................... 29/33 M, 33 F, 749,
29/33 K, 741, 564, 564.1, 564.6, 564.7, 564.8,
566, 566.1; 227/88, 90, 91, 84

[56] References Cited

U.S. PATENT DOCUMENTS

| Re. 27,968 | 4/1974 | Ragard et al. | 227/90 |
|---|---|---|---|
| 3,636,611 | 1/1972 | Rosenbaum | 29/749 X |
| 4,403,407 | 9/1983 | Mazzola | 29/749 |
| 4,696,424 | 9/1987 | Misawa et al. | 227/90 X |

*Primary Examiner*—Z. R. Bilinsky
*Attorney, Agent, or Firm*—Spencer T. Smith

[57] ABSTRACT

A jumper wire feeder which can be mounted on an apparatus for automatically inserting axial components and is capable of cutting wires consecutively to a predetermined length by means of an inserting tool. The wire is fed by a servomotor drive to a predetermined length between right and left inserting tool portions.

3 Claims, 9 Drawing Sheets

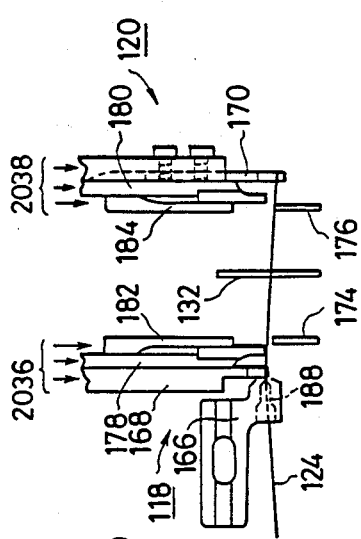
FIG. 8C
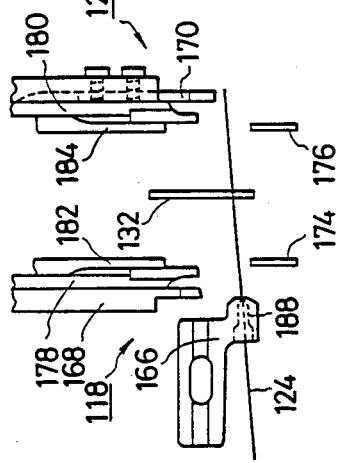
FIG. 8B
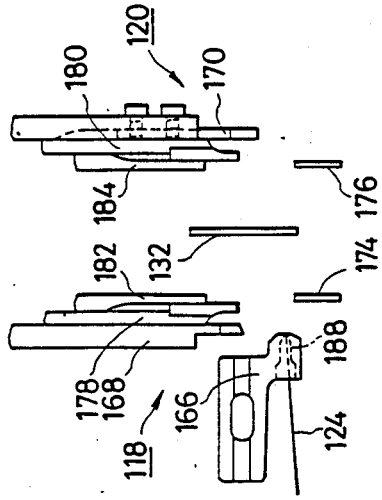
FIG. 8A
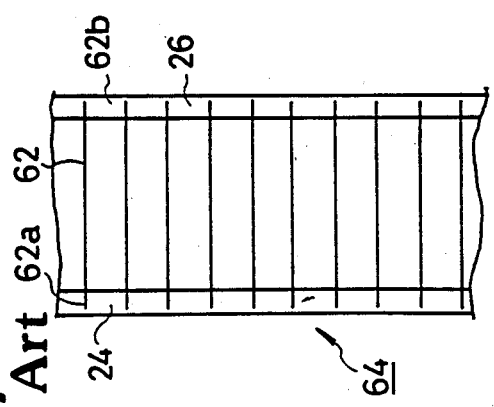
FIG. 7
Prior Art
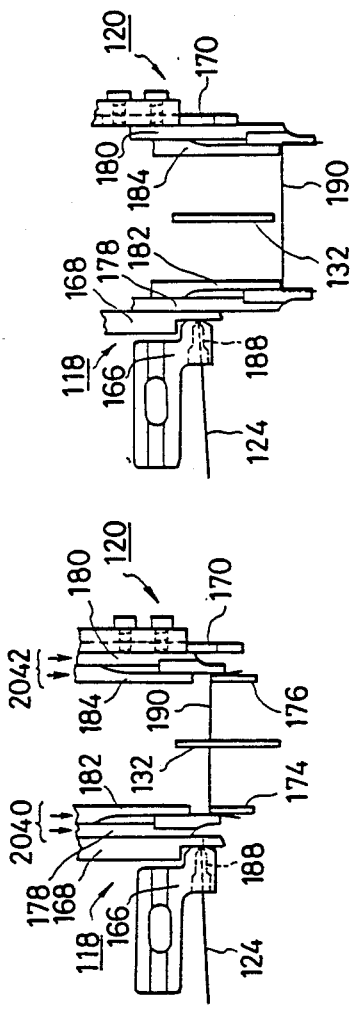
FIG. 8E
FIG. 8D

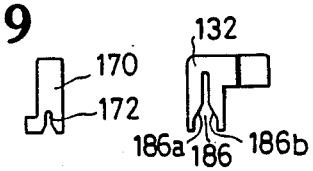
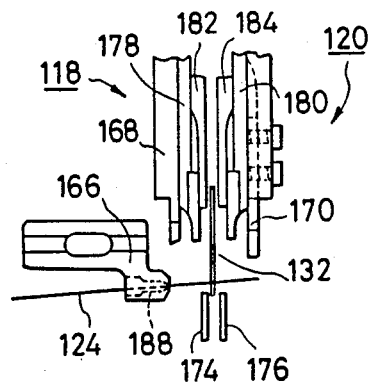

AUTOMATIC JUMPER WIRE FEEDER

BACKGROUND OF THE INVENTION

1. Field of the Invention

The present invention relates to an automatic jumper wire feeder, and more particularly to an automatic jumper wire feeder which is installed in an apparatus for automatically inserting axial components.

2. Summary of the Prior Art

An apparatus for automatically inserting axial components which automatically inserts axial components, e.g., coaxial components such as resistors, into a printed-wiring board is already known. Such apparatuses are disclosed in, for instance, U.S. Pat. Nos. 2,896,213 and 3,488,672.

OBJECTS OF THE INVENTION

Accordingly, an object of the present invention is to provide an automatic jumper wire feeder which can be mounted on an apparatus for automatically inserting axial components, and is capable of cutting wires consecutively to a predetermined length by means of an inserting tool, bending the cut jumper wires, and inserting the same into a printed wiring board.

Another object of the present invention is to provide an automatic jumper wire feeder which enables a fast response speed and a fast inserting speed for the entire feeder by feeding the wires by means of a servomotor, and is also capable of accurately determining an appropriate feeding length.

[Measures for Overcoming the Problem]

The present invention is characterized in that there is provided an automatic jumper wire feeder which consecutively cuts a wire to a predetermined length and bends and inserts the cut jumper wire into a printed-wiring board by means of an inserting tool, comprising: right and left inserting tool portions movable in a synchronous fashion in such a manner that each moves the same amount in mutually opposite directions; and a servomotor for feeding the wire from one inserting tool portion to the other inserting tool portion by a predetermined length, the servomotor being so adapted as to feed a certain length of the wire between the right and left inserting tool portions.

BRIEF DESCRIPTION OF THE DRAWINGS

FIG. 7 is a diagram illustrating jumper wires in which a plurality of jumper wires are aligned and taped by an adhesive tape;

FIGS. 8A, 8B, 8C, 8D and 8E are diagrams explaining the operation of the two inserting tools;

FIG. 9 is a side elevational view of a wire and guide;

FIG. 10 is a side elevational view of a center guide portion;

FIG. 11 is a diagram illustrating a state in which an interval between the two inserting tools has become minimum;

DESCRIPTION OF THE PREFERRED EMBODIMENT

Figure 1:
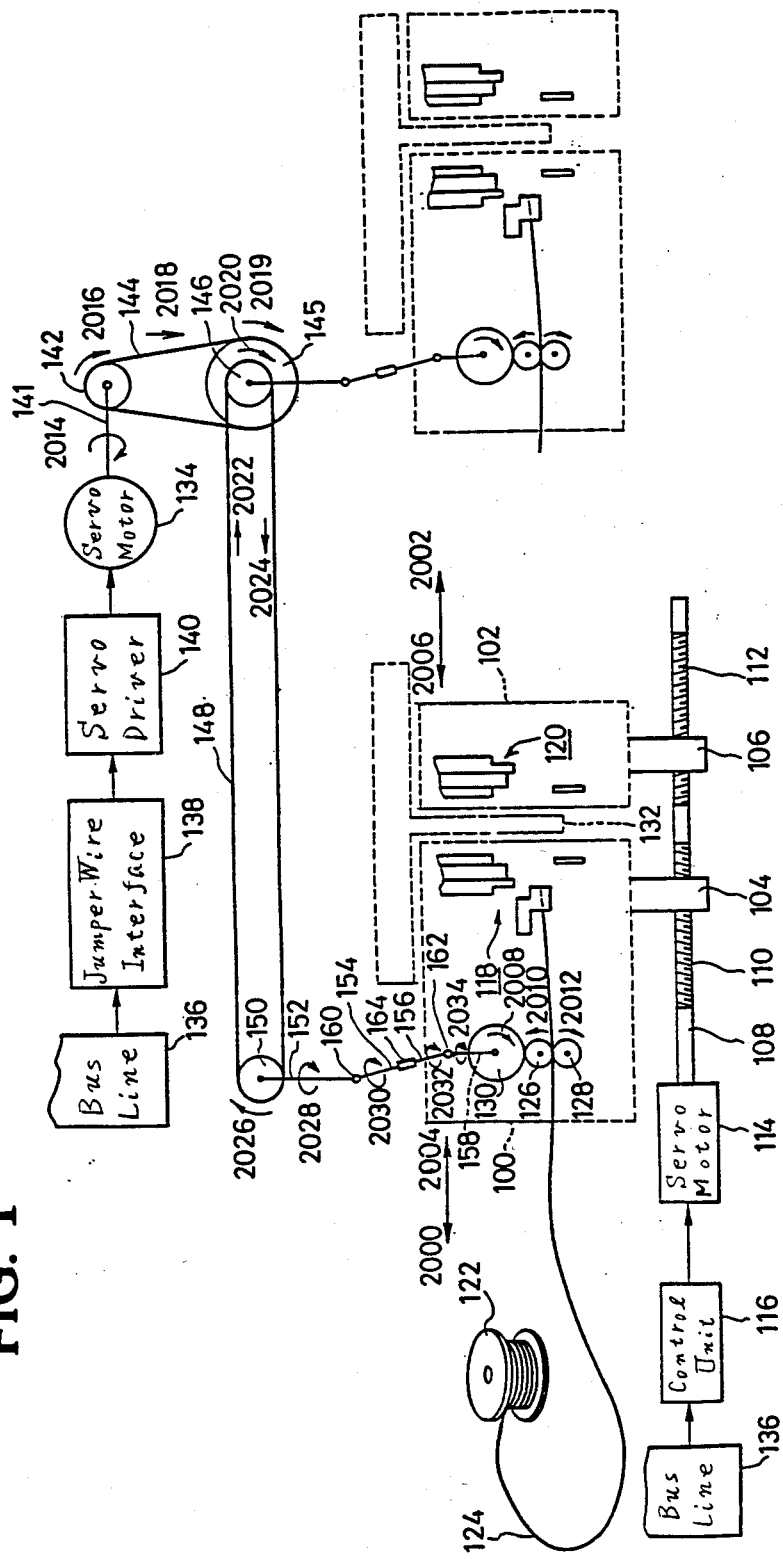
FIG. 1 is a schematic diagram of an automatic jumper wire feeder according to an embodiment of the present invention.

The following description relates to what is shown in the drawings as prior art.

Figure 2:
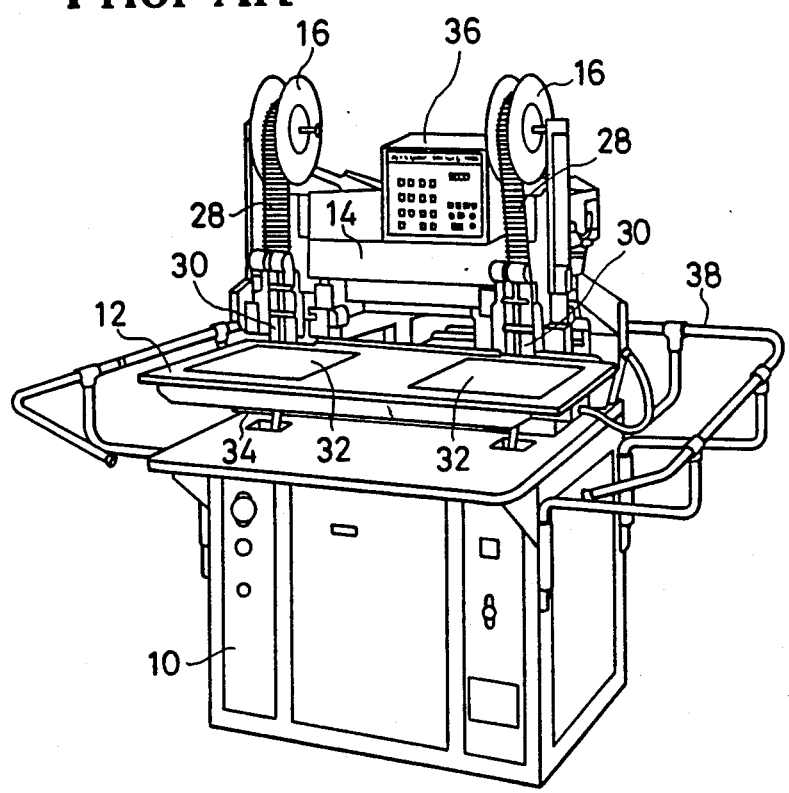
FIG. 2 is an external perspective view of a conventional apparatus for automatically inserting axial components.

FIG. 2 shows such a conventional apparatus for automatically inserting axial components.

In FIG. 2, an X-Y table 12 is mounted on a base 10, which has a support 14 thereabove. The support 14 has a rotatable reel 16. Meanwhile, as show in FIG. 3, an axial electronic component (e.g., a resistor) 18 is arranged such that the end portions 20a, 22a of lead wires 20,22 on both sides thereof are adhered to adhesive tapes 24, 26. This arrangement makes it possible to obtain an electronic components carrying belt 28 in which a plurality of axial electronic components 18 are aligned and taped by the adhesive tapes 24, 26.

Figure 3:
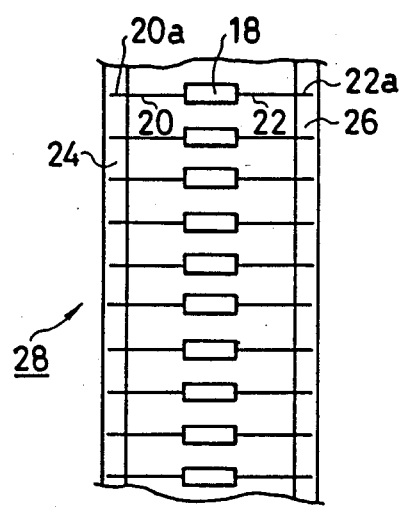
FIG. 3 is a diagram illustrating an electronic components belt in which a plurality of axial electronic component are aligned and taped by an adhesive tape.

As shown in FIG. 3, this electronic components carrying belt 28 is wound around the reel 16, and the electronic components carrying belt 28 wound around the reel 16 is supplied to an inserting tool 30. In addition, a printed-wiring board 32 in which holes for insertion of the electronic component 18 have been formed in advance is mounted on the X-Y table 12. The inserting tool cuts the lead wires 20, 22 of one of the electronic components 18 on the electronic components carrying belt 28 to a predetermined length, bends the lead wires 20, 22 in correspondence with the appropriate interval for insertion, and inserts the lead wires 20, 22 into the hoes of the printed-wiring board 32.

Subsequently, the lead wires 20, 22 projecting below the underside of the printed-wiring board 32 are cut to a predetermined length and bent by a cut and clinch unit 34. In this way, the electronic component 18 is mounted on the printed-wiring board 32.

Incidentally, in FIG. 2, a microcomputer (not shown) is incorporated into the base 10, while the support 14 is provided with a control panel 36. Reference numeral 38 denotes a safety guard pipe.

Furthermore, the apparatus shown in FIG. 2 is provided with two sets of inserting tools 30 and reels 16 and is adapted to be capable of simultaneously mounting the electronic components 18 on two printed-wiring boards 32. However, the number of inserting tools 30 need not be confined to two, and one or three or more inserting tools 30 may alternatively be employed.

Next, detailed description will be made of the inserting tool 30.

Figure 4:
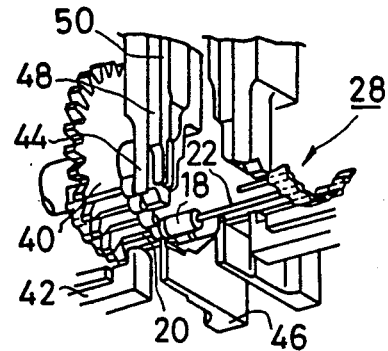
FIG. 4 is an external view of an inserting tool as seen from below.

FIG. 4 shows an arrangement of the inserting tool 30.

In FIG. 4, the electronic components carrying belt 28 is fed by a taped component feeding gear 40 in such a manner that the lead wires 20, 22 of the electronic component 18 are engaged with the feeding gear 40. A sheer block 42 and a shear bar 44 are provided to cut the lead wires 20, 22 of the electronic component 18 to a predetermined length. An inside former 46 and an outside former 48 are provided to bend and retain the lead wires 20, 22. In addition, a driver end 50 is provided to insert the lead wires 20, 22 into the printed-wiring board 32. Furthermore, the feeding gear 40, shear block 42, shear bar 44, inside former 46, outside former 48 and driver end 50 are provided as two pairs, respectively, each pair being adapted to operate simultaneously with respect to both lead wires 20, 22.

Figure 5:
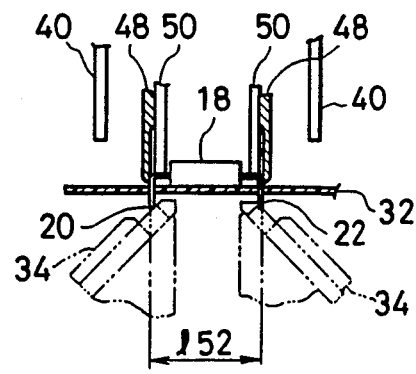
FIG. 5 is a cross-sectional view illustrating a state in which the leads of an electronic component are inserted in the holes of a printed wiring board by an outside former and a driver end.

FIG. 5 shows a state in which the lead wires 20, 22 are inserted in the holes of the printed-wiring board 32 by means of the outside former 48 and the driver end 50. In FIG. 5 is shown the cut and clinch unit 34 for cutting and bending the lead wires 20, 22 projecting below the underside of the printed-wiring board 32. Incidentally, this cut and clinch unit 34 is also provided as two pairs, each pair being adapted to operate simultaneously with respect to both lead wires 20, 22. Incidentally, in this Figure, the length 52 indicates the insertion interval of the electronic component 18.

[Operation of the Inserting Tool]

Referring next to FIGS. 6A to 6I, which show the inserting tool 30 in operation, description will be made of the operation of the inserting tool 30. In FIGS. 6A to 6I, since the feeding gears 40, shear blocks 42, shear bars 44, inside formers 46, outside formers 48, and driver ends 50 are bilaterally symmetrical, only those on the left-hand side are shown, and those on the right-hand side are omitted. However, the operation of those on the right-hand side is identical with that of those on the left-hand side.

Figure 6A:
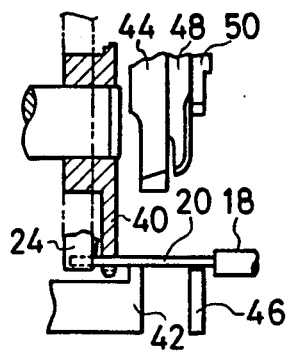
FIGS. 6A, 6B, 6C, 6D, 6E, 6F, 6G, 6H and 6I are diagrams explaining the operation of the inserting tool.

In FIG. 6A, the electronic component 18 is fed by the feeding gear 40, and the lead wire 20 is retained by the shear block 42 and the inside former 46, thereby setting the electronic component 18.

Figure 6B:
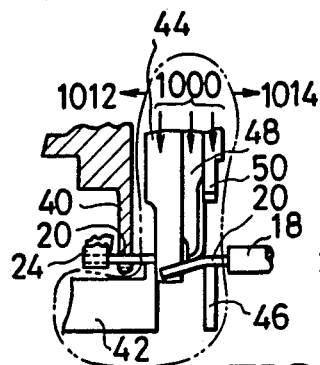

In FIG. 6B, the shear bar 44, outside former 48 and driver end 50 are lowered integrally in the direction of the arrow 1000, and the lead wire 20 is cut to predetermined length by means of the sear block 42 and the shear bar 44.

Figure 6C:
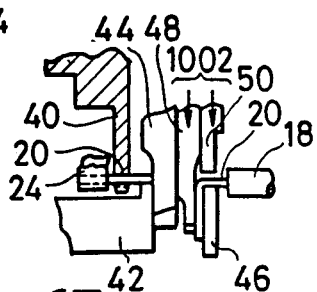

In FIG. 6C, the outside former 48 and the driver end 50 are lowered integrally in the direction of the arrow 1002, and then the lead wire 20 retained by the inside former 46 is bent by the outside former 48 so as to be formed.

Figure 6D:
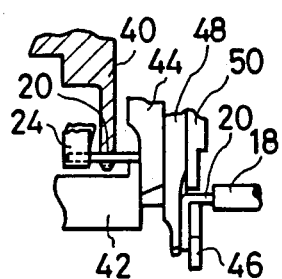

In FIG. 6D, since the bending of the lead wire 20 has been completed, the inside former 46 recedes to the rear side of the tape, and the lead wire 20 is then held by the outside former 48 and the driver end 50.

Figure 6E:
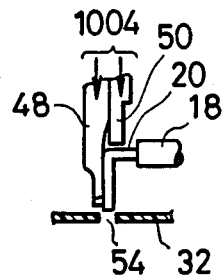
Figure 6F:
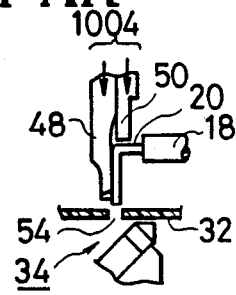

In FIG. 6E, the outside former 48 and the driver end 50 are lowered integrally in the direction of the arrow 1004 so as to insert the lead wire 20 into the hole 54 of the printed-wiring board 32. Incidentally, as shown in FIG. 6F, the cut and clinch unit 34 is raised to the underside of the printed-wiring board 32 before the lead wire 20 is inserted into the hole 54 of the printed-wiring board 32.

Figure 6G:
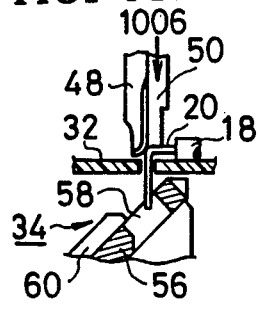

In FIG. 6G, the outside former 48 stops, and only the driver end 50 is lowered in the direction of the arrow 1006. Then, the lead wire 20 passes through the hole 54 of the printed-wiring board 32 and enters the hole 58 of the fixed knife 56 of the cut and clinch unit 34. Incidentally, the cut and clinch unit 34 is constituted by the fixed knife 56 and a movable knife 60.

Figure 6H:
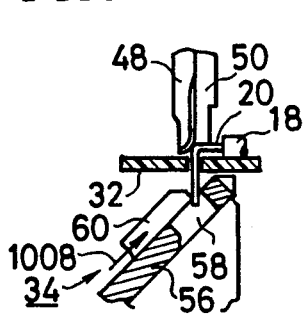
Figure 6I:
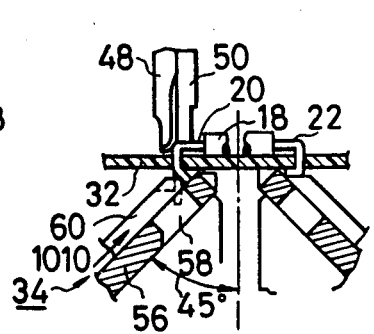

In FIG. 6H, the movable knife 60 moves in the direction of the arrow 1008. Subsequently, as shown in FIG. 6I, the movable knife 60 moves further in the direction of the arrow 1010 and bends the lead wire 20 onto the underside of the printed-wiring board 32. Incidentally, the fixed knife 56 and the removable knife 60 are set to an angle of 45° with respect to the vertical direction.

As described above, the electronic component 18 is inserted into the printed-wiring board 32. The shear block 42, shear bar 44, inside former 46, outside former 48, and driver end 50 move integrally in the transverse direction as viewed in the Figure (refer to the arrows 1012 and 1014 shown in FIG. 6B). Similarly, the right-hand shear block, shear bar, inside former, outside former, and driver end also move integrally in the transverse direction as viewed in the Figure, so that it is possible to adjust the insertion interval (refer to 52 shown in FIG. 5) of the electronic component 18.

As described above, electronic components are inserted into printed-wiring boards in an apparatus for automatically inserting axial components.

Next, when inserting a jumper wire into a printed-wiring board, the aforementioned apparatus for automatically inserting axial components is employed. To use this apparatus, however, as shown in FIG. 7, it is necessary to cause both ends 62a, 62b of a jumper wire 62 to be adhered to the adhesive tapes 24, 26 so as to tape the jumper wires 62 at fixed intervals and to feed a taped jumper wire belt 64 into the inserting tool 30 (refer to FIG. 2) of the automatically inserting apparatus. For the reason, there have been disadvantages in that separate taping machines are required to tape the jumper wires, and that this taping entails the cost of tapes and the cost of the taping process.

In addition, as electronic equipment tends to become compact and lightweight and to be produced at low cost, there has been a mounting demand for inserting wires into printed-wiring boards as automatically as possible. Furthermore, if low-cost one-sided substrates are used and the number of wiring sections is increased using jumper wires, it becomes possible to produce compact and lightweight products at low cost. Hence, there has also been a heightening demand for inserting machines which are used exclusively for jumper wires. However, when using an inserting machine exclusively used for jumper wires, it is necessary to separately install another apparatus for automatically inserting axial components so as to insert other axial components. Therefore, there are problems in securing a place for installation and in terms of cost.

In the present invention, the right and left inserting tool portions are moved the same amount in mutually opposite directions in such a manner that the interval between the two inserting tool portions will reach a predetermined length, the servomotor feeds a predetermined length of wire, corresponding to the interval between the two inserting tool portions, through one inserting tool portion to the other inserting tool portion, the wire is cut to a predetermined length by means of the two inserting tool portions, and the jumper wire thus cut is bent and inserted into the printed wiring board.

The embodiments of the present invention will be described hereafter with reference to the accompanying drawings.

FIG. 1 schematically illustrates the arrangement of an automatic jumper wire feeder according to an embodiment of the present invention. In the feeder shown in FIG. 1, two pairs of right and left inserting tool portions are provided and are so adapted as to be able to simultaneously install jumper wires simultaneously into two printed-wiring boards. However, description will be given hereinunder of just one of the two pairs.

A left inserting tool portion 100 and a right inserting tool portion 102 are movable by identical amounts in a synchronous fashion and in mutually opposite directions. In other words, the support 104 of the left inserting tool portion 100 and the support 106 of the right inserting tool portion 102 are engaged with a ball screw 108, and threads are formed on the threaded portions 110, 112 of the ball screw 108 in such a manner that they are oriented in mutually opposite directions. The ball screw 108 is adapted to be rotated by means of a servomotor 114 which is controlled by a control unit 116.

In consequence, if the servomotor 114 is rotated by means of the control unit 116, the ball screw 108 rotates, which in turn causes the two inserting tool portions 100, 102 to move in the direction of arrows 2000, 2002, respectively, thereby increasing an interval between the two inserting tool portions 100, 102. On the other hand, if the ball screw 108 rotates in the opposite direction, the inserting tool portions 100, 102 move in the direction of arrows 2004, 2006, respectively, thereby making the interval between the two inserting tool portions 100 and 102 narrower. In this way, the interval between the two inserting tool portions 100, 102 can be adjusted.

The left inserting tool portion 100 and the right inserting tool portion 102 include a left inserting tool 118 and a right inserting tool 120. A wire 124 fed from a bobbin 122 is cut to a predetermined length by the two inserting tools 118, 120, and the jumper wire thus cut is bent and inserted into a printed-wiring board.

A drive roller 126 and a driven roller 128 are provided for the left inserting tool portion 100 so as to feed the wire 124 from the left inserting tool 118 to the right inserting tool 120 by a predetermined length, the teeth of the drive roller 126 meshing with a gear 130. As a result of the rotation of the gear 130 in the direction of the arrow 2008, the drive roller 126 and the driven roller 128 rotate in the direction of the arrows 2010, 2012, respectively, so as to feed the wire 124.

A center guide portion 132 is provided between the two inserting tool portions 100 and 102. The wire 124 is guided by this center guide portion 132 as it is fed from the left inserting tool 118 to the right inserting tool 120, so as to smoothen the feeding of the wire 124. The center guide portion 132 cannot move in the transverse direction and stays in a neutral position.

A servomotor 134 for feeding the wire 124 is controlled by a bus line 136, a jumper wire interface 138, and a servo driver 140. As the shaft 141 of the servomotor 134 rotates in the direction of the arrow 2014, a pulley 142 rotates in the direction of the arrow 2016. Consequently, a timing belt 144 rotates in the direction of the arrow 2018, thereby rotating a pulley 145 in the direction of the arrow 2019 as well as a pulley 146, which is concentric therewith, in the direction of tie arrow 2020. AS a result, a timing belt 148 moves in the direction of the arrows 2022, 2024, which in turn causes a pulley 150 to rotate in the direction of the arrow 2026 and a shaft 152 to rotate in the direction of the arrow 2028. A shaft 154 then rotates in the direction of the arrow 2030, a shaft 156 rotates in the direction of the arrow 2032, and a shaft 158 rotates in the direction of the arrow 2034. Consequently, as mentioned above, the gear 130 rotates in the direction of the arrow 2008 to feed the wire 124 by means of the drive roller 126 and the driven roller 128.

The shafts 152 and 154 are coupled by means of a universal joint 160; the shafts 156 and 158, by means of a universal joint 162; and the shafts 154 and 156, by means of a spline 164.

Accordingly, even if the left inserting tool portion 100 moves in the direction of the arrow 2000 or 2004, the rotation of the servomotor 134 is transmitted positively, without exerting any excess force on the gear 130, by means of the universal joints 160, 162 and the spline 164.

Description will be made hereinunder of the inserting tools 118, 120 of the inserting tool portions 100, 102, with reference to FIG. 8A.

A shear block 166 and a shear bar 168 are provided to cut the wire 124 to a predetermined length, and a wire end guide 170 is provided to guide and hold the end of the wire 124. The side of the wire end guide 170 has a configuration shown in FIG. 9, and is adapted such that the end of the wire 124 is guided through a groove 172 and held therein. In addition, inside formers 174, 176 and outside formers 178, 180 are provided to bend and hold the wire 124. Furthermore, driver ends 182, 184 are provided to insert the jumper wire cut to a predetermined length into a printed-wiring board. The shear bar 168, inside former 174, outside former 178, and driver end 182 of the inserting tool 118, on the one hand, and the wire end guide 170, inside former 176, outside former 180, and driver end 184 of the inserting tool 120, on the other, are adapted to operate simultaneously with respect to the wire 124.

Furthermore, a center guide portion 132 is provided between the inserting tools 118 and 120, and is adapted such that, when the wire 124 is fed from the inserting tool 118 to the inserting tool 120, the wire 124 is guided by this center guide portion 132. In other words, the side of the center guide portion 132 has a configuration shown in FIG. 10, and is adapted such that the wire 124 fed from the inserting tool 118 is guided by a groove 186 in the center guide portion 132 so as to be led to the inserting tool 120.

Description will be made hereinunder of the operation of the inserting tools 118, 120 with reference to FIGS. 8A to 8E.

In FIGS. 8A and 8B, the wire 124 is fed out from a hole 188 in the shear block 166, is guided by the center guide portion 132, and reaches the lower portion of the wire end guide 170.

In FIG. 8C, the shear bar 168, the outside former 178, and the driver end 182 are lowered integrally in the direction of the arrow 2036, and, at the same time, the wire end guide 170, the outside former 180, and the driver end 184 are lowered integrally in the direction of the arrow 2038. Consequently, the wire 124 is cut to a predetermined length by means of the shear block 166 and the shear bar 168, and the end of the wire 124 is held by the wire end guide 170.

In FIG. 8D, the outside former 178 and the driver end 182 are lowered integrally in the direction of the arrow 2040, and, at the same time, the outside former 180 and the driver end 184 are lowered integrally in the direction of the arrow 2042. Consequently, the jumper wire 190 held by the inside formers 174, 176 is bent and formed by means of the outside formers 178, 180.

Incidentally, between the step shown in FIG. 8C and the step shown in FIG. 8D, the center guide portion 132 is also lowered at the same stroke as that of the shear bar 168 and the wire end guide 170, but, since a groove 186 in the center guide portion 132 is vertically elongated, as shown in FIG. 10, the groove 186 provides an escape to the wire 124. In addition, the tapers 186a, 186b of the groove 186 serve to guide the end of the wire 124 to immediately below the groove 172 of the wire end guide 170 when the center guide portion 132 is lowered.

In FIG. 8E, since the bending of the jumper wire 190 has been competed, the inside formers 174, 176 recede to the rear side of the tape, with the result that the jumper wire 190 is held by the outside former 178 and the driver end 182 as well as the outside former 180 and the driver end 184.

Thereafter, as is known, the jumper wire 190 is inserted into a printed-wiring board.

As described above, the wire 124 is cut to a predetermined length by means of the inserting tools 118, 120, and the jumper wire 190 thus cut is bent and inserted into the printed-wiring board.

Furthermore, the inserting tools 118, 120 are adapted to be movable the same amount in mutually opposite directions. In FIGS. 8A to 8E, the interval between the inserting tools 118 and 120 is the largest, whereas, in FIG. 11, the interval between the inserting tools 118 and 120 is the smallest.

Upon completion of the insertion of the jumper wire 190 into a printed-wiring board, the interval between the inserting tools 118 and 120 varies when the shear bar 168, and outside former 178 and the driver end 182 as well as the wire end guide 170, the outside former 180, and the driver end 184 are raised. This is because time is required in changing the interval between the inserting tools 118 and 120.

Figure 12:
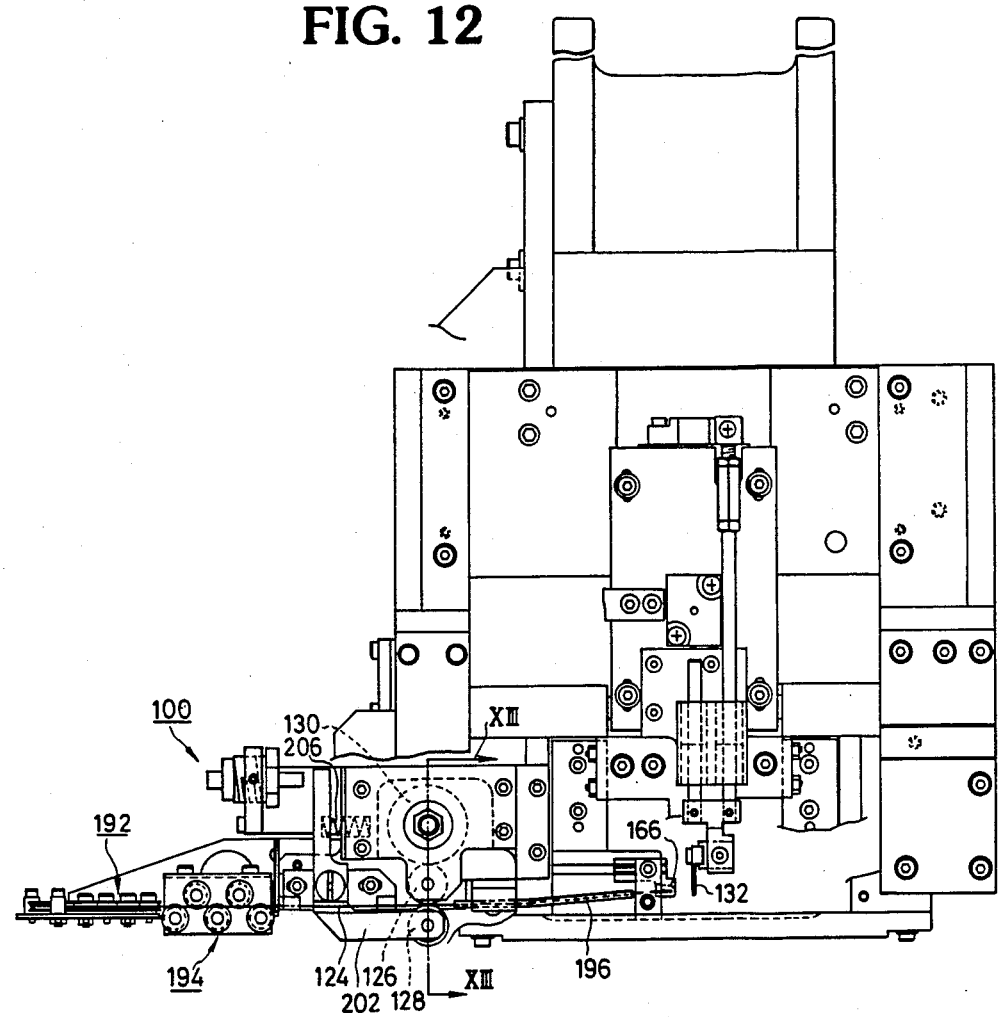
FIG. 12 is a diagram illustrating in greater detail an arrangement of the automatic jumper wire feeder according to the embodiment of the present invention.
Figure 13:
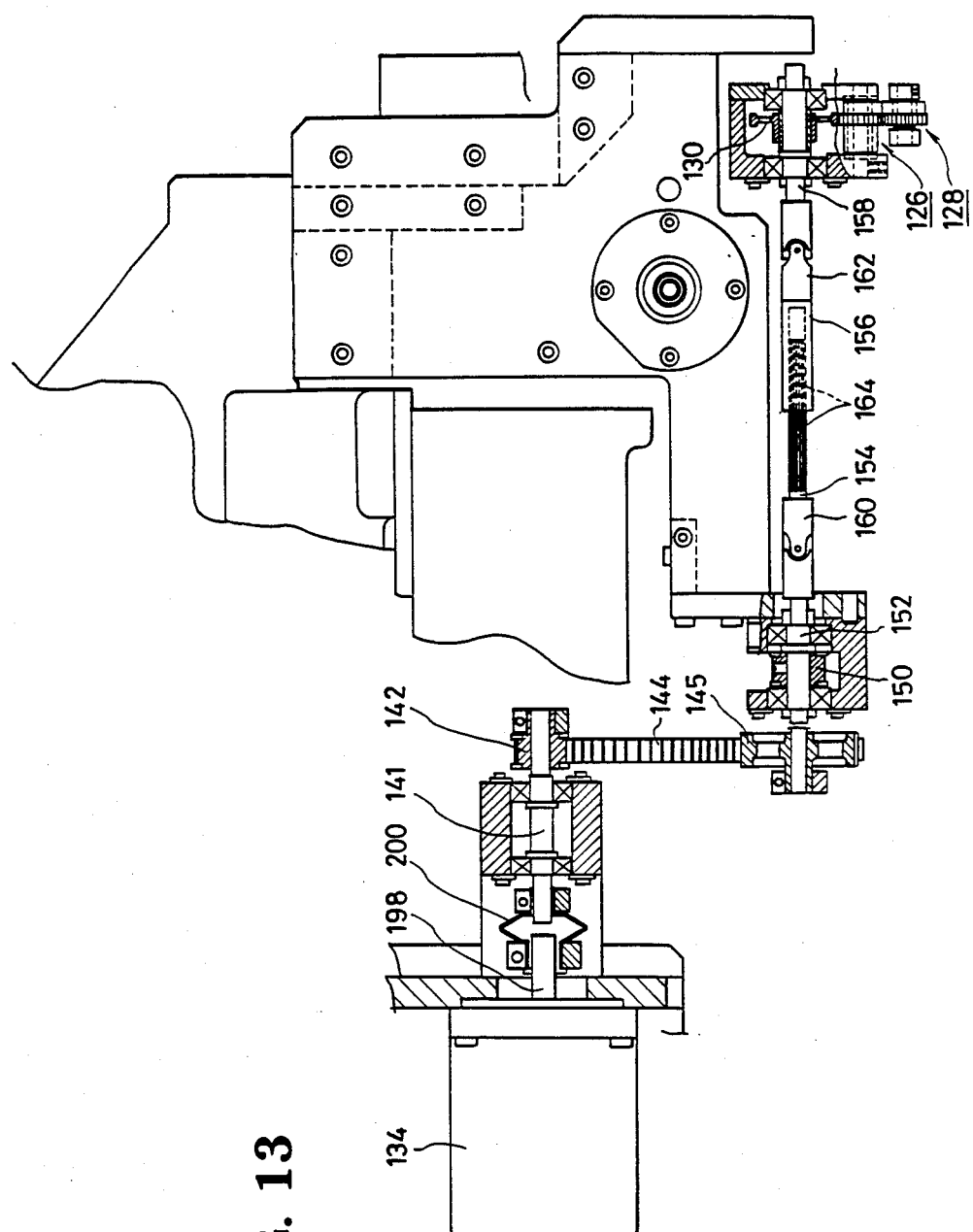
FIG. 13 is a cross sectional view taken along the line XIII—XIII of FIG. 12.

FIG. 12 illustrates in greater detail the arrangement of the automatic jumper wire feeder according to the embodiment of the present invention, while FIG. 13 shows a cross-sectional view taken along the line XIII—XIII of FIG. 12.

In FIG. 12, although the center guide portion 132 is show, the right inserting tool portion 102 is not shown. Similarly, although the shear block 166 is shown in the left inserting tool portion 100, the shear bar 168, the inside former 174, the outside former 178, and the driver end 182 are not shown.

Furthermore, in the left inserting tool portion 100, the wire 124 fed from the bobbin passes through strainers 192, 194, further passes through a guide tube 196 via the drive roller 126 and the driven roller 128, and is supplied to the shear block 166. Incidentally, the guide tube 196 is inclined upwardly toward the shear block 166 at an angle of about 5°.

With reference to FIG. 13, description will be made of an arrangement for rotating the drive roller 126 and the driven roller 128 by means of the servomotor 134.

The shaft 198 of the motor 134 is coupled with the shaft 141 via a coupling 200, and the rotation of the pulley 142 of the shaft 141 is transmitted to the pulley 145 by means of the timing belt 144. Although not shown in FIG. 13, the pulley 146 also rotates as a result of the rotation of the pulley 145, and this rotation is transmitted to the pulley 150 by means of the timing belt 148 (see FIG. 1). The rotation of the pulley 150 is transmitted to the gear 130 via the shaft 152, the universal joint 160, the shaft 154, the spline 164, the shaft 156, the universal joint 162, and the shaft 158. The teeth of the drive roller 126 meshes with the gear 130, and also meshes with the teeth of the driven roller 128. The rotation of the gear 130 causes the drive roller 126 to rotate, which in turn rotates the driven roller 128.

Even if the left inserting tool portion 100 moves in the direction of the front and rear sides of the paper strip as viewed in FIG. 13 (in the transverse direction as viewed in FIG. 12), the rotation of the servomotor 134 is positively transmitted to the gear 130 by virtue of the universal joints 160, 162 and the spline 164, as mentioned earlier.

Figure 14:
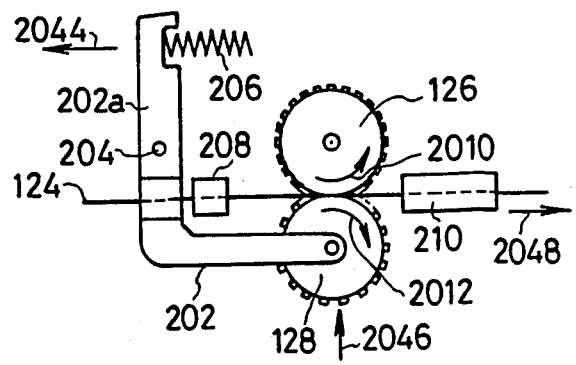
FIG. 14 is a diagram illustrating a state in which a wire is sent by means of a drive roller and a driven roller.
Figure 15:
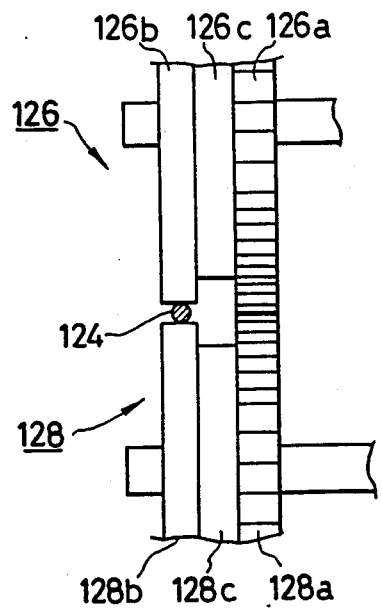
FIG. 15 is an explanatory diagram in which the contact portions of the drive roller and the driven roller are shown in an enlarged state.

FIG. 14 shows the drive roller 126 and the driven roller 128, while FIG. 15 gives an enlarged view of the contact portions of the two rollers 126, 128.

In FIG. 14, the drive roller 128 is pivotally supported by a lever 202. The lever 202 is pivotally supported by a shaft 204, and the end portion 202a thereof is urged in the direction of the arrow 2044 by a spring 206, so that the driven roller 128 is urged about the shaft 204 in the direction of the arrow 2046. Consequently, the driven roller 128 is pressed against the drive roller 126. As the drive roller 126 rotates in the direction of the arrow 2010, the driven roller 128 is caused to rotate in the direction of the arrow 2012, thereby supplying the wire 124 in the direction of the arrow 2048 by means of the two rollers 126, 128. Incidentally, reference numerals 208, 210 denote a passage.

In FIG. 15, the teeth 126a, 128a of the two rollers 126, 128 mesh with each other, and are adapted such that the feed surfaces 126b, 128b thereof press and feed the wire 124. Incidentally, reference numerals 126c, 128c of the rollers 126, 128 denote an escape portion.

[Advantages of the Invention]

As described above, according to the automatic jumper wire feeder of the present invention, it is possible to mount the automatic jumper wire feeder on an apparatus for automatically inserting axial components and this automatic jumper wire feeder makes it possible to cut a wire to a predetermined length and to bend and inset the cut piece of wire into a printed-wiring board by means of an inserting tool.

Furthermore, according to the present invention, since it is not necessary to tape jumper wires of a predetermined length at fixed intervals, a taping machine can be dispensed with, making it possible to avoid the cost entailed by taping.

Still further, according to the present invention, since the feeding of jumper wires is effected easily, if the number of wiring sections is increased, it is possible to readily obtain circuits similar to both-sided substrates by inserting jumper wires using low-cost one-sided substrates without using both-sided substrates.

Still further, since the automatic jumper wire feeder of the present invention can easily be mounted on an apparatus for automatically inserting axial components, the apparatus for automatically inserting axial components can be used as a conventional apparatus for automatically inserting axial components by dismounting the automatic jumper wire feeder and by mounting the machine for automatically inserting the axial components. Accordingly, even if both-sided substrates are to be used frequently, and the number of jumper wires inserted is to decrease, it is possible to effect the insertion of axial components other than jumper wires by dismounting the automatic jumper wire feeder of the present invention and by mounting a machine for automatically inserting the axial components.

Still further, since the wire is fed by means of a servomotor, in comparison with wire feeder which employs a piston cylinder mechanism, the response speed is faster and, hence, the inserting speed of the entire feeder is faster. In addition, since the feed length can be determined accurately, it is easy to make appropriate adjustment.

What is claimed is:

1. An automatic jumper wire feeder which consecutively cuts a wire to a predetermined length and bevels and inserts the cut jumper wire into a printed wiring board comprising:
   a spool of wire,
   a shear block,
   means for feeding said wire from said spool through said shear block,
   means for operating said feeding means to advance a predetermined length of wire through said shear block,
   central guide means located midway along the predetermined length of wire extending beyond said shear block,
   said central guide means including an enlarged tapered groove opening leading to a narrow elongated slot, said tapered groove opening downwardly and receiving the wire as it is fed from said shear block,
   wire forming means including a pair of spaced formers located below and spaced from the portion of the wire extending beyond said shear block,
   outside guide means including a tapered groove opening for guiding the free end of the wire,
   means for locating said outside guide means with said grooved opening facing downwardly and spaced upwardly above the free end of the wire extending beyond said shear block, said center and outside guide means being conjointly lowered from a first position whereat said center guide means groove has received the wire and whereat said outside guide means groove is spaced above the wire, to a second position whereat said outside guide means groove has received the wire and bent it downwardly into engagement with one of said formers and the wire has moved into the elongated slot of said center guide means,
   means for cutting the bent wire at said shear block,
   driving means for conforming the cut wire to said forming means to form the cut wire into a jumper wire, said driving means including a pair of drivers spaced above said formers when said outside guide means is at said second position, said pair of drivers displacement downwardly conjointly with said center and outside guide means to conjointly form the cut wire into a jumper wire.

2. An automatic jumper wire feeder according to claim 1 further comprising means for conjointly and equally displacing said formers in mutually opposite directions to change the spacing therebetween.

3. An automatic jumper wire feeder according to claim 2 wherein said former displacing means comprises a translating screw having opposed threaded portions.

* * * * *